US008039957B2

(12) United States Patent
Heinrich et al.

(10) Patent No.: US 8,039,957 B2
(45) Date of Patent: Oct. 18, 2011

(54) SYSTEM FOR IMPROVING FLIP CHIP PERFORMANCE

(75) Inventors: Ethan Santosh Heinrich, San Pedro, CA (US); Samuel Doug Tonomura, Rancho Palos Verdes, CA (US)

(73) Assignee: Raytheon Company, Waltham, MA (US)

( * ) Notice: Subject to any disclaimer, the term of this patent is extended or adjusted under 35 U.S.C. 154(b) by 171 days.

(21) Appl. No.: 12/402,166

(22) Filed: Mar. 11, 2009

(65) Prior Publication Data

US 2010/0233851 A1 Sep. 16, 2010

(51) Int. Cl.
H01L 21/50 (2006.01)

(52) U.S. Cl. .......... 257/737; 257/778; 257/E21.499

(58) Field of Classification Search .......... 438/108, 438/121; 257/E21.409, 778, 737, 738, 774, 257/E21.499

See application file for complete search history.

(56) References Cited

U.S. PATENT DOCUMENTS

| 5,751,552 | A | 5/1998 | Scanlan et al. |
| 6,081,429 | A * | 6/2000 | Barrett ................ 361/767 |
| 6,154,369 | A | 11/2000 | Martinez, Jr. et al. |
| 6,781,075 | B2 | 8/2004 | Dove et al. |
| 6,975,035 | B2 | 12/2005 | Lee |
| 6,979,904 | B2 | 12/2005 | Farnworth et al. |
| 7,378,733 | B1 * | 5/2008 | Hoang et al. ........... 257/724 |
| 7,420,249 | B2 | 9/2008 | Sato et al. |
| 7,422,978 | B2 | 9/2008 | Lee |
| 2007/0090517 | A1 | 4/2007 | Moon et al. |
| 2008/0251943 | A1 | 10/2008 | Corisis et al. |

OTHER PUBLICATIONS

Gilleo, Ken, http://www.flipchips.com/gilleoUF.html; "Underfill Update: NUF, MUF, WUF, and Other Stuff", Oct. 22, 2008, 4 pages.
Riley, George A., http://www.flipchips.com/tutorial01.html, "Introduction to Flip Chip: What, Why, How", Oct. 22, 2008, 6 pages.

* cited by examiner

Primary Examiner — Roy Potter
(74) Attorney, Agent, or Firm — Christie, Parker & Hale, LLP

(57) ABSTRACT

A system for improving flip chip performance is provided. In one embodiment, the invention relates to an assembly configured to improve performance of a flip chip device, the assembly including a semiconductor die having an active surface and a back surface, the active surface including a plurality of conductive pads, an interposer substrate having a first surface in electrical contact with the active surface of the semiconductor die and a second surface, a space between the active surface of the semiconductor die and the first surface of the interposer substrate, where the space is essentially free of underfill material, and a carrier substrate having a top surface in electrical contact with the second surface of the interposer.

24 Claims, 4 Drawing Sheets

SYSTEM FOR IMPROVING FLIP CHIP PERFORMANCE

BACKGROUND

The present invention relates to a system for improving flip chip performance. More specifically, the present invention relates to a system and for improving flip chip performance by removing the underfill beneath a flip chip assembly.

Flip chip assemblies are used in many applications today due to advantages in size, flexibility, performance, reliability and cost over other packaging assemblies. Such assemblies provide direct electrical connection of face down, or flipped, electrical components onto substrates, circuit boards, or other carriers using conductive bumps on chip bond pads. Older technologies such as wire bonding use face-up chips having longer lead lengths to input/output (I/O) pads.

Flip chip assemblies provide for substantial reductions in the required board mounting area as flip chip board connections are substantially shorter than those of other packages having contact leads. Flip chip assemblies often give the highest electrical performance of any assembly method. High electrical performance is due to much shorter lead lengths to I/O pads as compared to wire bonding, resulting in reduced capacitance and inductance. Greater I/O flexibility is achieved by use of an entire active surface of the flip chip die for connections rather than only perimeter locations as is the convention for wire bonding techniques.

Flip chip assemblies also feature a rugged interconnection method. With a number of interconnections across the surface area of the die and a commonly used adhesive underfill, the flip chip interconnections to carrier substrates are extremely robust. The adhesive underfill typically joins the entire surface of the flip chip die to a carrier substrate. The underfill protects electrical connections from moisture or other similar hazards while also providing additional mechanical strength to the interconnection between the flip chip and the carrier substrate. More importantly, however, the underfill compensates for any mismatch in the coefficient of thermal expansion (CTE) between the flip chip and the carrier substrate. The underfill is generally comprised of a non-conductive material such as epoxy or other non-conductive adhesives.

In some applications, however, use of an underfill can be undesirable. Interposers, which provide electrical connections between chips of one form factor to carrier substrate footprints of another form factor (e.g., integrated circuit to ball grid array (BGA)), have been proposed to connect flip chip assemblies to carrier substrates. However, such interposers often require an increased footprint as compared to that of the flip chip and use an underfill.

SUMMARY OF THE INVENTION

Aspects of the present invention relate to a system for improving flip chip performance. In one embodiment, the invention relates to an assembly configured to improve performance of a flip chip device, the assembly including a semiconductor die having an active surface and a back surface, the active surface including a plurality of conductive pads, an interposer substrate having a first surface in electrical contact with the active surface of the semiconductor die and a second surface, a space between the active surface of the semiconductor die and the first surface of the interposer substrate, where the space is essentially free of underfill material, and a carrier substrate having a top surface in electrical contact with the second surface of the interposer.

DETAILED DESCRIPTION OF THE INVENTION

Figure 1:
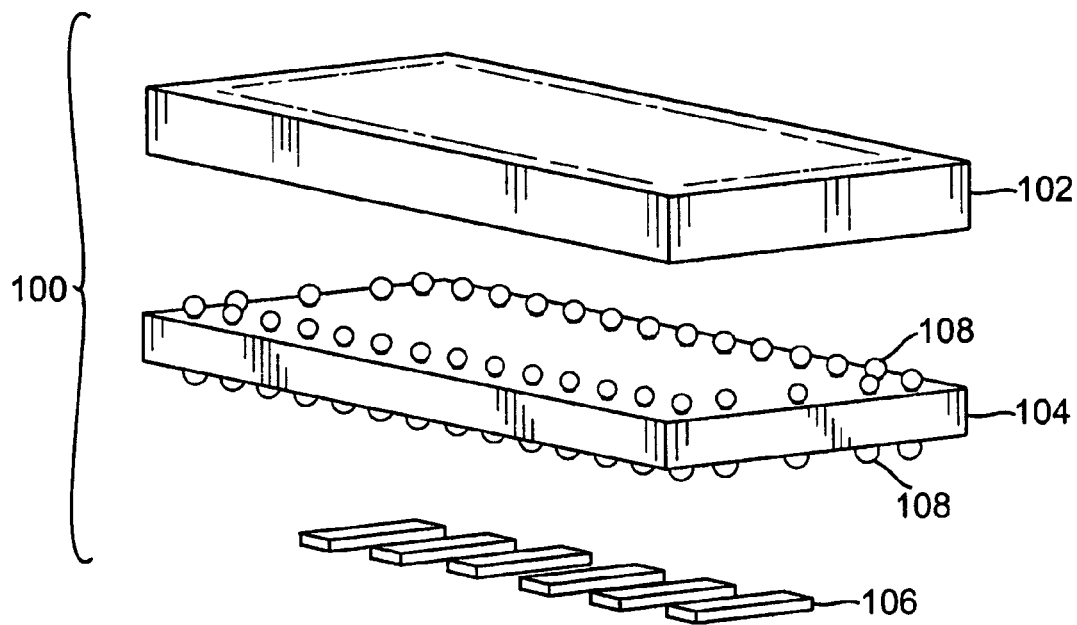
FIG. 1 is an exploded perspective view of a flip chip assembly including a flip chip, an interposer, and multiple passive components in accordance with one embodiment of the invention.

As described above, the use of underfills in some flip chip applications can be undesirable. In a number of applications, underfills improve the performance characteristics of a flip chip. However, in other applications, the underfill can substantially impair the performance characteristics of a flip chip. For example, flip chips using radio frequency (RF) often experience impaired performance when an underfill is added between the flip chip and carrier substrate. In particular, the performance of monolithic microwave integrated circuits (MMICs), which typically operate at microwave frequencies, is noticeably impaired when an underfill is used.

While not bound by any particular theory, it is believed that, in general, underfill material affects the electrical performance of an MMIC due to a difference in permittivity (dielectric constant) and dissipation factor (dielectric loss tangent) of the dielectric material as compared to the corresponding properties of air. In addition, the dielectric constant and dissipation factor of the most commonly used underfill materials are frequency dependent, and therefore become more detrimental to performance at higher frequencies. Typically, the models used for designing MMICs assume air will be used as the dielectric interface to the active surface of the MMIC substrate. In one example, the models assume an active surface of GaAs with an air dielectric interface. Depending on the selection of underfill materials, vastly different boundary conditions can be presented to the active surface of the MMIC, which can cause performance degradation. For a flip chip MMIC application, the degradation in performance can be attributed to the change in parasitics seen at bump interconnects, the change in RF characteristics of passive elements embedded in the circuit design, and the change in the RF parameters of active transistors used in the MMIC circuit. Depending on the circuit topology and design specific features, the change in dielectric constant and the increase in dielectric loss tangent, as compared to the dielectric constant assumed for air, will cause degradation in intended performance as a function of frequency.

Turning now to the figures, embodiments of the current invention provide a system and a method for improving the performance of flip chips by relocating the underfill away from the flip chips using an interposer. In some embodiments, the improved system includes an interposer coupled by an underfill to a carrier substrate (e.g., printed circuit board or PCB) and coupled to a flip chip such that there is a space between the flip chip and the interposer that is essentially free of underfill material. In such case, flip chip performance is greatly improved, particularly at high frequencies where many of today's flip chip devices operate. Embodiments of the current invention can therefore solve the underfill problem, as described above, that Applicants have discovered.

In a number of embodiments, the improved assemblies include passive components (e.g., DC passives such as capacitors) mounted to the interposer. In such case, the interposer effectively provides additional carrier substrate "real estate", or free substrate surface area, enabling more compact designs and/or space for additional components. In addition, the close proximity of DC passives to active flip chip devices can further improve flip chip performance.

In some embodiments, the improved assemblies include an interposer with a footprint that matches the footprint of the flip chip devices. In one embodiment, such interposers use through-via technology to match the flip chip footprint. In matching the flip chip footprints, the improved assemblies provide a "drop-in" component that can be added to existing flip chip designs without a need to make design changes, to the layout of the carrier substrate for example.

In some embodiments, the improved assemblies are used with RF flip chip assemblies. In one such embodiment, the improved assemblies are used with MMIC flip chip assemblies. In other embodiments, the improved assemblies are used with other flip chip devices.

FIG. 1 is a exploded perspective view of a flip chip assembly 100 including a flip chip 102, an interposer 104, and multiple passive components 106 in accordance with one embodiment of the invention. The interposer 104 includes a number of solder balls 108 disposed on both a top surface and a bottom surface of the interposer 104.

In the embodiment illustrated in FIG. 1, the bottom surface or active surface (not visible) of the flip chip 102 has a rectangular shape and the interposer 104 is shaped to match the active surface of the flip chip substrate. In other embodiments, the flip chip and interposer can have other planar shapes. In the embodiment illustrated in FIG. 1, the solder balls 108 are disposed along a perimeter region of the top and bottom surfaces of the interposer. In other embodiments the solder balls can be disposed at other locations along the top and bottom surfaces. In various embodiments, the solder balls are disposed along the active surface of the flip chip. In some embodiments, the footprint of the interposer is made to be smaller than the active surface of the flip chip.

Figure 2:
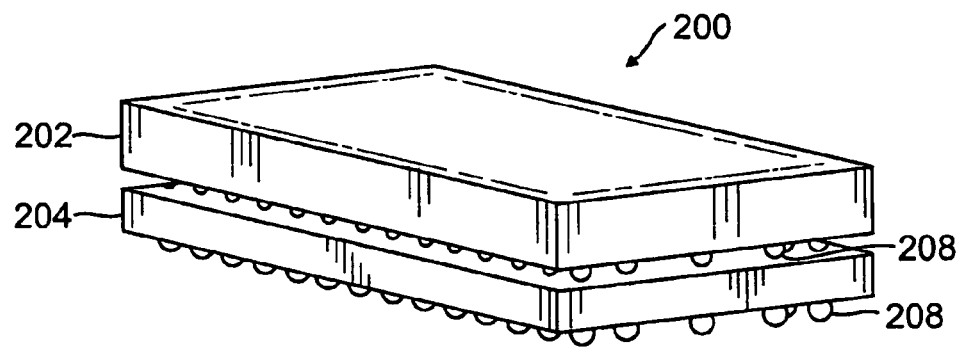
FIG. 2 is a top perspective view of a flip chip assembly including an interposer in accordance with one embodiment of the invention.

FIG. 2 is a top perspective view of a flip chip assembly 200 including a flip chip 202 coupled to an interposer 204 in accordance with one embodiment of the invention. The flip chip 202 is coupled to the interposer 204 using a number of solder balls 208.

Figure 3:
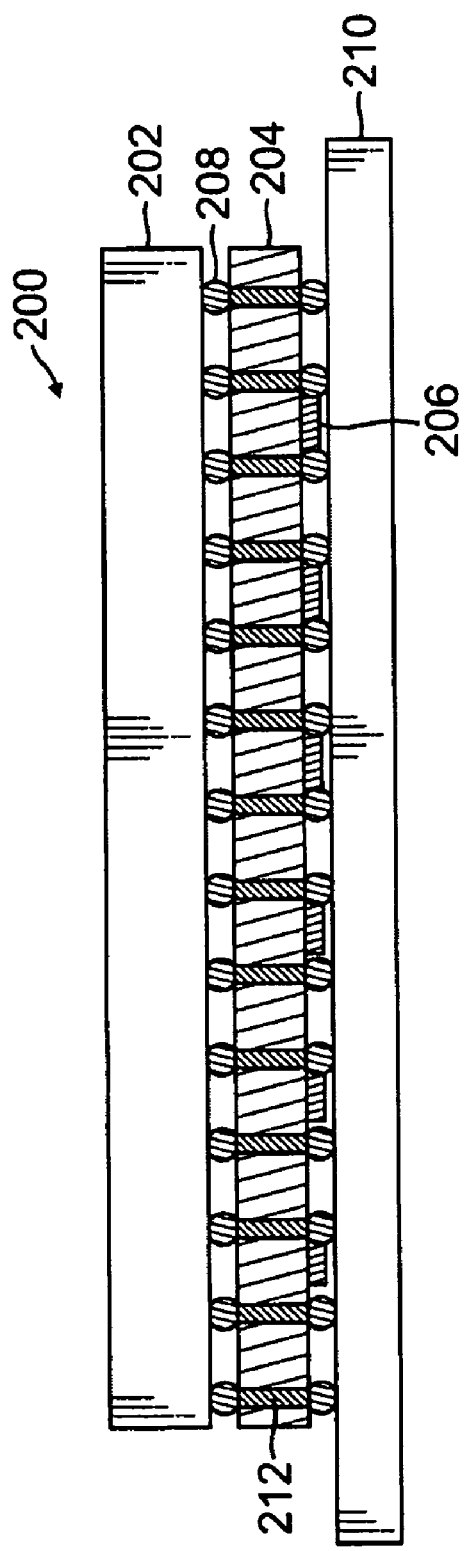
FIG. 3 is a side view of a cross section of the assembly of FIG. 2 coupled to a carrier substrate in accordance with one embodiment of the invention.

FIG. 3 is a side view of a cross section of the assembly 200 of FIG. 2 including a flip chip 202 and an interposer 204 coupled to a carrier substrate 210 in accordance with one embodiment of the invention. The flip chip 202 is coupled to the interposer 204 by a first number of solder balls 208. The interposer 204 is coupled to the carrier substrate 210 by a second number of solder balls 208. In many embodiments, the first number of solder balls and the second number of solder balls are equal. Several passive components 206 are coupled to a bottom surface of the interposer 204, where the bottom surface faces a top surface of the carrier substrate 210. The passive components can be capacitors, resistors, inductors, or other appropriate DC passive devices. In other embodiments, active components can be coupled to the bottom surface of the interposer 204.

Numerous through-vias 212 are disposed vertically within the interposer 204 such that each solder ball 208 in electrical contact with the flip chip 202 is electrically connected by a through-via 212 to a solder ball 208 in electrical contact with the carrier substrate 210. In other embodiments, other arrangements of through-vias can be used. In the illustrated embodiment, the one to one matching of contact pads on the improved flip chip assembly to contact pads on the carrier substrate, or footprint matching, using the through-vias allows for drop in replacement of flip chips in existing designs. In some embodiments, performance of existing flip chips can be substantially increased by inserting the improved flip chip assembly in place of the existing flip chips.

While not illustrated in FIG. 3, the space or area between the bottom surface of the interposer 204 and the top surface of the carrier substrate 210 is generally filled with an underfill. In many embodiments, the underfill is a non-conductive/dielectric adhesive material. In some embodiments, the underfill is an alumina or silica filled epoxy (e.g., $Al_2O_3$ or $SiO_2$). The space between the top surface of the interposer 204, where the top surface faces the flip chip 202, and a bottom surface of the flip chip 202, or active surface, is however substantially free of any underfill. In a number of embodiments, the space is substantially empty, other than the solder balls 208, and is comprised of air.

In one embodiment, a partial or perimeter underfill that encapsulates only the solder balls 208 between the carrier substrate 210 and the interposer 204 can be used. In another embodiment, a partial or perimeter underfill that encapsulates only the solder balls 208 between the flip chip 202 and the interposer 204 can be used. In such case, the partial underfill of the flip chip does not degrade performance as much as the typical full underfill.

In the embodiment illustrated in FIG. 3, the footprint or physical size and layout of the interposer 204 is shaped to match the footprint of the flip chip 202. In a number of embodiments, the footprint, of the flip chip for example, includes the physical size in terms of the length and width of the active surface of the flip chip 202. In some embodiments, the footprint also includes the layout of connection pads on the active surface of the flip chip 202. In other embodiments, the footprint of interposer is not matched to that of the flip chip. In one such embodiment, the footprint of the interposer is smaller than or larger than the footprint of the flip chip. While a specific number of passive components, solder balls and corresponding through-vias are illustrated in FIG. 3, those skilled in the art will recognize that fewer or greater numbers of such components can be used as well.

In other embodiments, multiple interposers can be used to provide additional surface area for mounting passives or other components. In one such embodiment having multiple interposers, the underfill is relocated even further from the flip chip device. In several embodiments, the close proximity of the passive components 206 to the flip chip 202 results in shortened lead lengths and improved flip chip performance.

Figure 4:
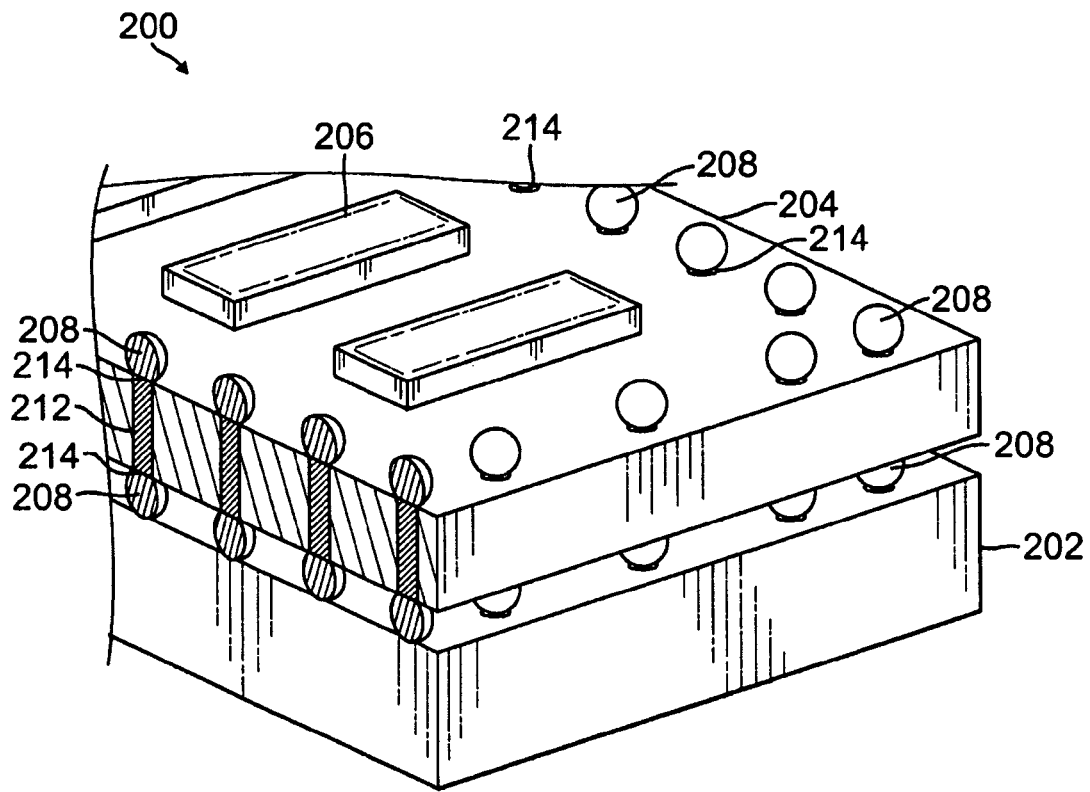
FIG. 4 is a bottom perspective view of a cross section of a portion of the assembly of FIG. 2.

FIG. 4 is a bottom perspective view of a cross section of a portion of the assembly 200 of FIG. 2. The flip chip assembly 200 includes a flip chip 202 coupled by a number of solder balls 208 to an interposer 204. The interposer 204 includes several passive components 206 mounted to the bottom surface of the interposer 204. The active or bottom surface of flip chip 202 includes a number of conductive pads 214, where each of the conductive pads 214 is coupled to one of the solder balls 208. The top surface of the interposer 204 (not visible) also includes a number of conductive pads 214. In most embodiments, the number and location of conductive pads 214 on the active surface of the flip chip 202 corresponds to the number and location of conductive pads 214 the top surface of the interposer 204.

The bottom surface of the interposer 204 similarly includes a plurality of conductive pads 214, where the number and location of such pads generally correspond to those of flip chip 202. The interposer 204 also includes a number of through-vias 212 that electrically couple conductive pads 214, having corresponding locations on each surface, to one another. In most embodiments, the through-vias 214 are through wafer vias disposed along vertical lines normal to the top or bottom surfaces of the interposer. In some embodiments, the through-vias are filled with copper or another suitably conductive material. In a number of embodiments, the interposer is made of FR4 or another suitable substrate material. In other embodiments, the interposer can be made of silicon or high resistivity silicon. In such case, the high resistivity silicon can provide reduced RF loss for electrical transitions through the interposer.

Figure 5:
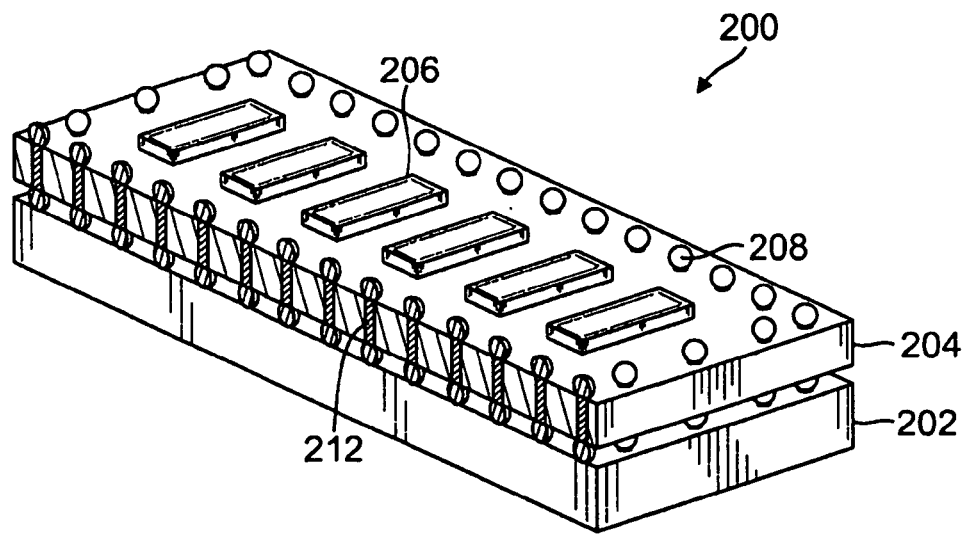
FIG. 5 is a bottom perspective view of a cross section of the assembly of FIG. 2.

FIG. 5 is a bottom perspective view of a cross section of the assembly 200 of FIG. 2. The flip chip assembly 200 includes a flip chip 202 coupled via solder balls 208 to an interposer 204. Passive components 206 are mounted to a bottom-surface of the interposer 204 and coupled by through-vias 212 to the flip chip 202. Since the passive components 206 are disposed on the bottom surface of the interposer 204 and close to the through-vias 212, the distance from the flip chip 202 to the passive components 206 is minimized. As a result of the minimized lead lengths to the passive components, flip chips in this configuration will generally perform better than conventional flip chips with longer lead lengths.

Figure 6:
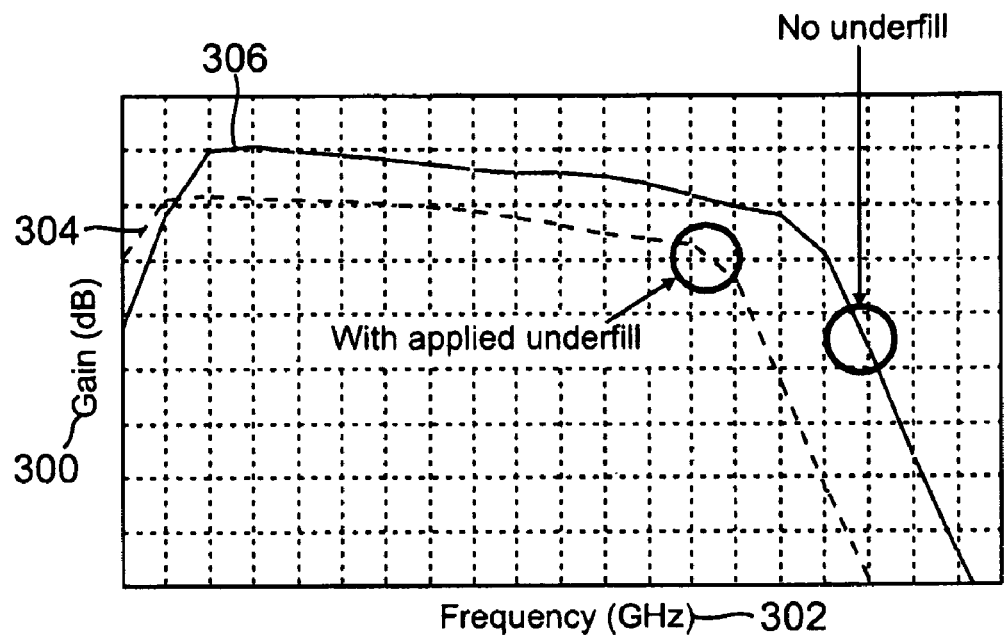
FIG. 6 is a graphical representation of gain versus frequency for a flip chip assembly with an underfill and a flip chip assembly without an underfill in accordance with one embodiment of the invention.

FIG. 6 is a graphical representation of gain 300 versus frequency 302 for a flip chip assembly with an underfill 304 and a flip chip assembly without an underfill 306 in accordance with one embodiment of the invention. The graph indicates that for the vast majority of frequencies in the gigahertz (GHz) range, the flip chip assembly without the underfill 306, disposed along the active surface of the flip chip, has greater gain than the flip chip assembly with the underfill 304. In particular, at higher frequencies, the gain for the flip chip assembly without the underfill 306 is substantially greater than the gain for the flip chip assembly with the underfill 304. Such a result is particularly helpful for high frequency flip chip designs commonly in use today.

Figure 7:
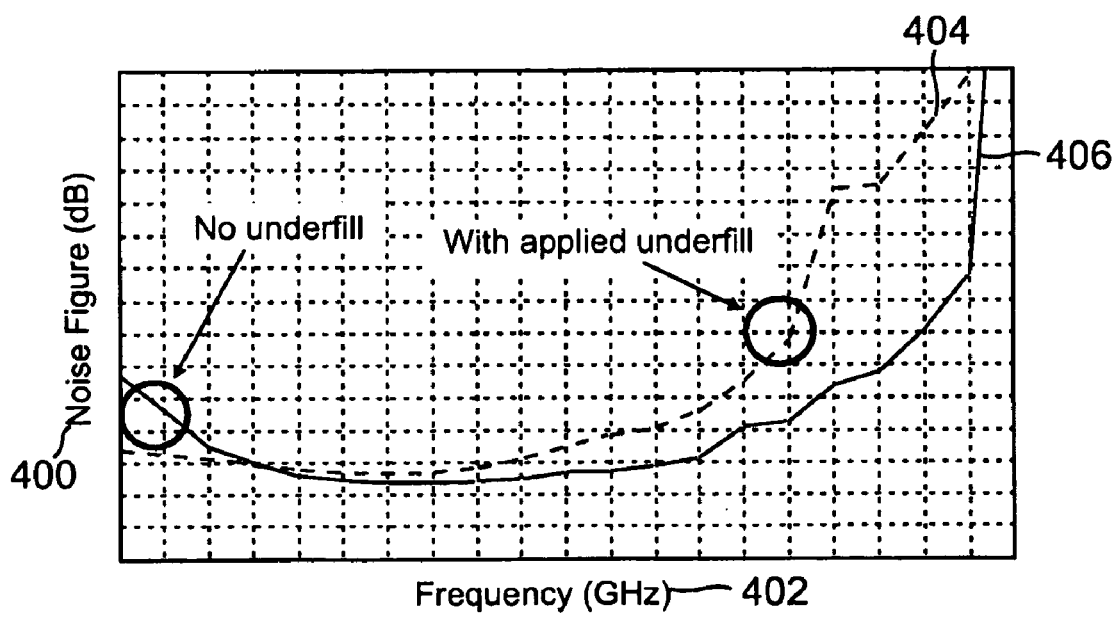
FIG. 7 is a graphical representation of noise figure versus frequency for a flip chip assembly with an underfill and a flip chip assembly without an underfill in accordance with one embodiment of the invention.

FIG. 7 is a graphical representation of noise FIG. 400 versus frequency 402 for a flip chip assembly with an underfill 404 and a flip chip assembly without an underfill 406 in accordance with one embodiment of the invention. The graph generally indicates better noise figure performance for the flip chip assembly without the underfill 406 than the flip chip assembly with the underfill 404. In particular, at higher frequencies, the noise figure for the flip chip assembly without the underfill 406 is substantially less than the noise figure for the flip chip assembly with the underfill 404. This result is also particularly helpful in today's high frequency flip chip designs.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

What is claimed is:

1. An assembly configured to improve performance of a flip chip device, the assembly comprising:
    a semiconductor die having an active surface and a back surface, the active surface comprising a plurality of conductive pads;
    an interposer substrate having a first surface in electrical contact with the active surface of the semiconductor die and a second surface;
    a space between the active surface of the semiconductor die and the first surface of the interposer substrate, wherein the space is substantially free of underfill material;
    a carrier substrate having a top surface in electrical contact with the second surface of the interposer; and
    an underfill layer between the top surface of the carrier substrate and the second surface of the interposer substrate.

2. An assembly configured to improve performance of a flip chip device, the assembly comprising:
    a semiconductor die having an active surface and a back surface, the active surface comprising a plurality of conductive pads;
    an interposer substrate having a first surface in electrical contact with the active surface of the semiconductor die and a second surface;
    a space between the active surface of the semiconductor die and the first surface of the interposer substrate, wherein the space is substantially free of underfill material;
    a carrier substrate having a top surface in electrical contact with the second surface of the interposer;
    a plurality of vias disposed within the interposer, each via having a first contact point disposed at the first surface of the interposer and a second contact point disposed at the second surface of the interposer;
    a plurality of first solder balls disposed on the first surface of the interposer, wherein each first solder ball disposed at one of the plurality of first contact points; and
    a plurality of second solder balls disposed on the second surface of the interposer, each second solder ball disposed at one of the plurality of second contact points,
    wherein each of the plurality of first solder balls is configured to electrically couple one of the plurality of first contact points to one of the plurality of conductive pads, and
    wherein each of the plurality of second solder balls is configured to electrically couple one of the plurality of second contact points to one of a plurality of conductive pads on the surface of the carrier substrate.

3. An assembly configured to improve performance of a flip chip device, the assembly comprising:
    a semiconductor die having an active surface and a back surface, the active surface comprising a plurality of conductive pads;
    an interposer substrate having a first surface in electrical contact with the active surface of the semiconductor die and a second surface;
    a space between the active surface of the semiconductor die and the first surface of the interposer substrate, wherein the space is substantially free of underfill material; and
    a carrier substrate having a top surface in electrical contact with the second surface of the interposer,
    wherein the space contains air.

4. The assembly of claim 1, wherein the space consists essentially of air.

5. The assembly of claim 1, wherein the underfill layer comprises a non-conductive adhesive material.

6. The assembly of claim 1, further comprising:
   at least one circuit component mounted to the interposer substrate and electrically coupled to the semiconductor die.

7. The assembly of claim 6, wherein the at least one circuit component comprises a passive component.

8. The assembly of claim 7, wherein the passive component comprises a capacitor.

9. An assembly configured to improve performance of a flip chip device, the assembly comprising:
   a semiconductor die having an active surface and a back surface, the active surface comprising a plurality of conductive pads;
   an interposer substrate having a first surface in electrical contact with the active surface of the semiconductor die and a second surface;
   a space between the active surface of the semiconductor die and the first surface of the interposer substrate, wherein the space is substantially free of underfill material; and
   a carrier substrate having a top surface in electrical contact with the second surface of the interposer,
   wherein a footprint of the interposer is substantially matched to a footprint of the semiconductor die.

10. The assembly of claim 9, wherein the substantially matched footprint enables drop-in replacement of flip chips in existing designs.

11. An assembly configured to improve performance of a flip chip device, the assembly comprising:
   a semiconductor die having an active surface and a back surface, the active surface comprising a plurality of conductive pads;
   an interposer substrate having a first surface in electrical contact with the active surface of the semiconductor die and a second surface;
   a space between the active surface of the semiconductor die and the first surface of the interposer substrate, wherein the space is substantially free of underfill material; and
   a carrier substrate having a top surface in electrical contact with the second surface of the interposer,
   wherein a radio frequency integrated circuit comprises the semiconductor die.

12. The assembly of claim 11, wherein the radio frequency integrated circuit comprises a monolithic microwave integrated circuit.

13. The assembly of claim 1, wherein the space contains air.

14. The assembly of claim 1, wherein a footprint of the interposer is substantially matched to a footprint of the semiconductor die.

15. The assembly of claim 1, wherein a radio frequency integrated circuit comprises the semiconductor die.

16. The assembly of claim 3, wherein the space consists essentially of air.

17. The assembly of claim 3, further comprising an underfill layer between the top surface of the carrier substrate and the second surface of the interposer substrate, wherein the underfill layer comprises a non-conductive adhesive material.

18. The assembly of claim 3, further comprising at least one circuit component mounted to the interposer substrate and electrically coupled to the semiconductor die.

19. The assembly of claim 18, wherein the at least one circuit component comprises a passive component.

20. The assembly of claim 3, wherein a footprint of the interposer is substantially matched to a footprint of the semiconductor die.

21. The assembly of claim 9, wherein the space consists essentially of air.

22. The assembly of claim 9, further comprising an underfill layer between the top surface of the carrier substrate and the second surface of the interposer substrate, wherein the underfill layer comprises a non-conductive adhesive material.

23. The assembly of claim 9, further comprising at least one circuit component mounted to the interposer substrate and electrically coupled to the semiconductor die.

24. The assembly of claim 23, wherein the at least one circuit component comprises a passive component.

\* \* \* \* \*